United States Patent
Kim et al.

(10) Patent No.: US 7,579,621 B2
(45) Date of Patent: Aug. 25, 2009

(54) INTEGRATED BST MICROWAVE TUNABLE DEVICES USING BUFFER LAYER TRANSFER METHOD

(75) Inventors: Il-Doo Kim, Cambridge, MA (US); Harry L. Tuller, Wellesley, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 170 days.

(21) Appl. No.: 11/230,186

(22) Filed: Sep. 19, 2005

(65) Prior Publication Data

US 2006/0060894 A1 Mar. 23, 2006

Related U.S. Application Data

(60) Provisional application No. 60/610,996, filed on Sep. 17, 2004.

(51) Int. Cl.
*H01L 29/12* (2006.01)
(52) U.S. Cl. .............. 257/43; 257/613; 257/E31.003; 257/E31.092; 438/104; 438/455; 438/458
(58) Field of Classification Search .............. 438/775, 438/3, 104, 455, 458; 257/295, 43, 613, 257/E31.003, E31.092; 430/321
See application file for complete search history.

(56) References Cited

U.S. PATENT DOCUMENTS

| | | | |
|---|---|---|---|
| 5,877,070 A | 3/1999 | Goesele et al. | |
| 6,391,740 B1 | 5/2002 | Cheung et al. | |
| 6,391,799 B1 | 5/2002 | Di Cioccio | |
| 6,436,614 B1 * | 8/2002 | Zhou et al. | 430/321 |
| 6,500,732 B1 | 12/2002 | Henley et al. | |
| 6,764,864 B1 * | 7/2004 | Li et al. | 438/3 |
| 6,855,643 B2 * | 2/2005 | Nallan et al. | 438/775 |
| 7,274,058 B2 * | 9/2007 | Lee et al. | 257/295 |
| 2003/0064535 A1 | 4/2003 | Kub et al. | |
| 2003/0186521 A1 | 10/2003 | Kub et al. | |
| 2004/0029359 A1 | 2/2004 | Letertre et al. | |

OTHER PUBLICATIONS

Jun, Sungjin et al., "Dielectric properties of strained (Ba, Sr) TiO3 thin films epitaxially grown on Si with thin yttria-stabilized zirconia buffer layer" Applied Physics Letters, vol. 78, No. 17, Apr. 23, 2001. pp. 2542-2544.

Itotia et al. "DC Bias Effects on Bulk Silicon Porous Silicon Substrates" IEEE Antennas and Propagation Society International Symposium, 2003 Digest 2003, Jun. 22, 2003, vol. 4, pp. 663-666.

Lin et al., "Nova Cut TM Process: Fabrication of Silicon on Insulator Materials," IEEE International SOI Conference Proceedings, Oct. 7, 2002. pp. 189-191.

(Continued)

*Primary Examiner*—Ngan Ngo
*Assistant Examiner*—Benjamin Tzu-Hung Liu
(74) *Attorney, Agent, or Firm*—Gauthier & Connors LLP

(57) ABSTRACT

A BST microwave device includes a single crystal oxide wafer. A silicon dioxide layer is formed on the single crystal oxide layer. A silicon substrate is bonded on the silicon dioxide layer. A BST layer is formed on the single crystal oxide layer.

18 Claims, 2 Drawing Sheets

OTHER PUBLICATIONS

Trent et al., "Design and tolerance analysis of a 21 Ghz CPW-fed, Slot-Coupled, Microstrip Antenna on Etched Silicon," IEEE Antennas and Propogation Society International Symposium, Jun. 16, 2002, vol. 1, pp. 402-405.

Kim et al., "Growing BaTio3 thin films on Si (100) with MgO-buffer layers by sputtering," Thin Solid Films, vol. 281/282, No. 1/2. Aug. 1, 1996. pp. 449-452.

Cole M. W. et al., "Evaluation of Ta2O5 as a buffer layer film for integration of microwave tunable Ba1-xSrxTio3 based thin films with silicon substrates" Journal of Applied Physics, vol. 92, No. 7, Oct. 1, 2002. pp. 3967-3973.

Huang, L.-J. et al., "Hydrogen-Implantation Induced Blistering and Layer Transfer of LaAlO and Sapphire," 1999, The Electromechanical Society, Elechtromechanical and Solid-State Letters, 2 (5). pp. 238-239.

* cited by examiner

INTEGRATED BST MICROWAVE TUNABLE DEVICES USING BUFFER LAYER TRANSFER METHOD

PRIORITY INFORMATION

This application claims priority from provisional application Ser. No. 60/610,996 filed Sep. 17, 2004, which is incorporated herein by reference in its entirety.

BACKGROUND OF THE INVENTION

The invention relates to the field of BST microwave tunable devices, and in particular to an integrated BST microwave tunable device using a buffer layer transfer method.

$(Ba,Sr)TiO_3$ (BST), $(Ba,Zr)TiO_3$ (BZT) $(Ba,Hf)TiO_3$ (BHT), $SrTiO_3$ (ST), $Bi_{1.5}Zn_{1.0}Nb_{1.5}O_7$ (BZN series, B:Bi, Ba) and related thin films are promising materials for tunable microwave devices application such as electronically tunable mixers, oscillators, and phase shifters and filters. It will be appreciated by those of skill in the art that BST is representative of one or more related perovskite-like tunable dielectric materials.

An objective of the invention is to integrate tunable components into monolithic microwave integrated circuits (MMICs). Although microstrip planes are the most common transmission line component for microwave frequencies, the ground-plane is difficult to access for shunt connections necessary for active devices, when used in MMICs. The CPW (Coplanar Waveguide) is an attractive alternative, especially due to the ease of monolithic integration, as the ground plane runs adjacent to the transmission line. The possibility of creating BST microwave tunable devices on oxide substrates has been demonstrated in recent years. There is a great incentive to replicate these achievements on silicon-based wafers for integrated microwave device applications.

Much work has been done to obtain epitaxially grown ferroelectric thin films on Si substrates. Currently, chemical vapor deposition methods such as MBE (Molecular Beam Epitaxy) and ALD (Atomic Layer Deposition) and as well as physical vapor deposition methods such as pulsed laser deposition have been used. However, it has not been easy to obtain high quality buffer films without residual stress and defects resulting from a dimensional misfit between the crystal lattices.

SUMMARY OF THE INVENTION

According to one aspect of the invention, there is provided a BST microwave device. The BST microwave device includes a single crystal oxide wafer. A silicon dioxide layer is formed on the single crystal oxide layer. A silicon substrate is bonded on the silicon dioxide layer. A BST layer is formed on the single crystal oxide layer.

According to another aspect of the invention, there is provided a method of forming BST microwave device. The method includes providing a single crystal oxide wafer and forming a silicon dioxide layer on the single crystal oxide layer. A silicon substrate is bonded on the silicon dioxide layer. Also, the method includes forming a BST layer on the single crystal oxide layer.

DETAILED DESCRIPTION OF THE INVENTION

Single crystal ($MgO$, $SrTiO_3$, $LaAlO_3$, $Al_2O_3$, $MgAl_2O_4$, YSZ, $CeO_2$) buffer layers, with low loss, are first separated from the single crystal oxide wafers by a hydrogen or helium induced cutting method and then transferred to a Si wafer using wafer bonding technology. The basic structure for BST or $Bi_{1.5}Zn_{1.0}Nb_{1.5}O_7$ (BZN series, B:Bi, Ba) microwave devices are developed in one of the two following methods: (1) wafer bonding and ion cutting of $SiO_2$ covered single crystals, with ion implantation or (2) wafer bonding of $SiO_2$ covered double side polished single crystals and Si-micromachining (with/without ion implantation).

Figure 1A:
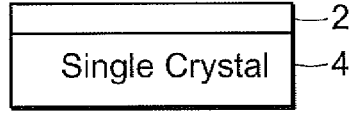
FIGS. 1A-1E are schematic diagrams illustrating wafer bonding and ion cutting of $SiO_2$ covered single crystals.
Figure 1B:
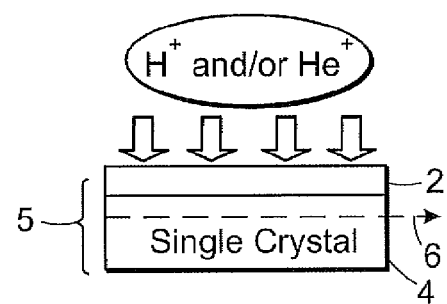
Figure 1C:
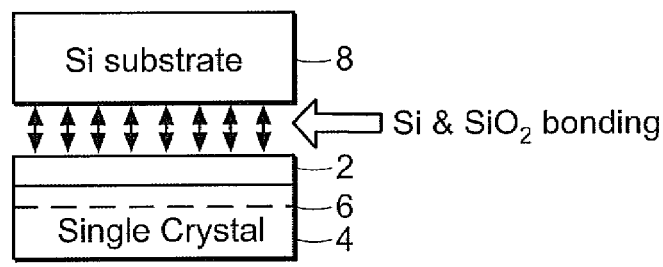
Figure 1D:
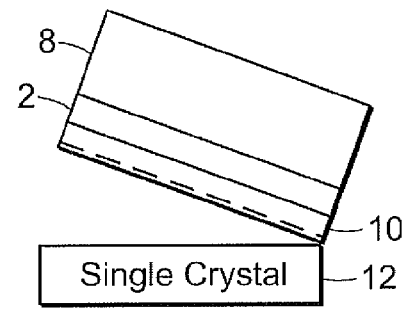
Figure 1E:
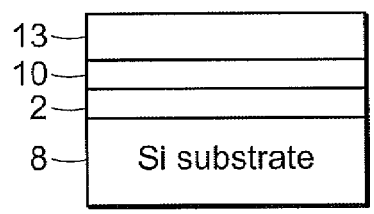

FIGS. 1A-1E are schematic diagrams illustrating wafer bonding and ion cutting of $SiO_2$ covered single crystals. FIG. 1A shows a $SiO_2$ thin or thick layer 2 that is deposited on a single crystal oxide wafer 4 (e.g. MgO, $SrTiO_3$, $LaAlO_3$, $Al_2O_3$, $MgAl_2O_4$, YSZ, $CeO_2$) using PECVD, LPCVD, and/or ALD for purposes of subsequent wafer bonding to the Si wafer 8. Note Si—$SiO_2$ or $SiO_2$—$SiO_2$ bonding is much easier, if one achieves very clean surfaces. FIG. 1B shows hydrogen being implanted into the $SiO_2$ covered single crystal 5 to a desired depth 6 (the hydrogen stopping range) at which cleavage is desired. Note that He can also be used for implantation. FIG. 1C shows a receiver Si (or $SiO_2$/Si) substrate 8 being bonded to the $SiO_2$ deposited single crystal 5 through direct wafer bonding technology. FIG. 1D shows the bonded wafers 12 being separated along the hydrogen implantation stopping region 6 by heat treatment, resulting in the transfer of a thin pure single crystal oxide 10 to the Si substrate 8. FIG. 1E shows high quality BST thin films 13 being deposited onto the single crystal oxide layer 10 bonded to the Si substrate 8. This film 13 is suitable for the fabrication of microwave tunable components such as resonator, phase shifter, tunable bandpass filter, or the like.

Figure 2A:
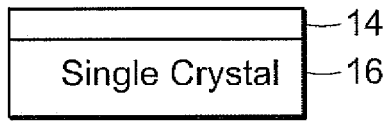
FIGS. 2A-2C are schematic diagrams illustrating wafer bonding of $SiO_2$ covered double side polished single crystals and Si-micromachining with/without ion implantation.
Figure 2B:
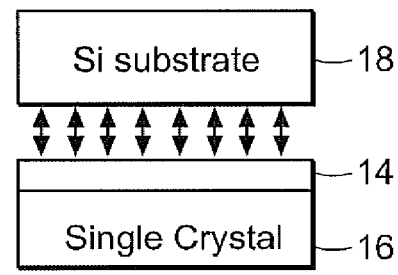
Figure 2C:
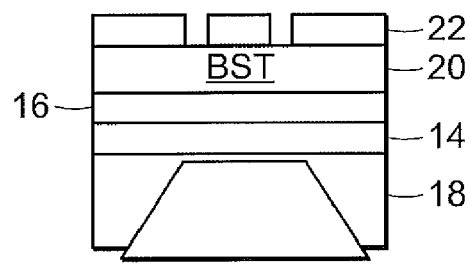

FIGS. 2A-2C are schematic diagrams illustrating wafer bonding of $SiO_2$ covered double side polished single crystals and Si-micromachining with/without ion implantation. FIG. 2A shows a thin or thick $SiO_2$ layer 14 being deposited onto various single crystal oxide wafers 16 (e.g. MgO, $SrTiO_3$, $LaAlO_3$, $Al_2O_3$, $MgAl_2O_4$, YSZ, $CeO_2$) using PECVD, LPCVD, and/or ALD. FIG. 2B shows a receiver substrate 18, such as Si or thick $SiO_2$/Si, being bonded to the $SiO_2$ deposited single crystal 14 through direct wafer bonding technology. If a thin buffer layer is needed, one can polish back the oxide single crystal 14. FIG. 2C shows high quality BST thin films 20 being deposited on the single crystal oxide layer 16. This film 20 is suitable for the fabrication of microwave components such as resonator, phase shifter and tunable bandpass filters, or the like. To reduce loss through the Si substrate 18, a portion of the Si substrate 18 below the microwave device is removed by micro-machining methods, for example, anisotropic KOH chemical etch. Note that Au electrodes 22 are formed on the BST layer 20 to complete microwave circuits.

The invention is an alternative to the buffer layer transfer technique by wafer bonding and ion cutting method. The advantage of the invention is the provision of the same environment as with single crystal substrate growth, for example, low surface roughness and high quality material.

Although the present invention has been shown and described with respect to several preferred embodiments thereof, various changes, omissions and additions to the form and detail thereof, may be made therein, without departing from the spirit and scope of the invention.

What is claimed is:

1. A BST microwave device comprising:
   a single crystal oxide wafer comprising $SrTiO_3$, $MgAl_2O_4$, YSZ, or $CeO_2$;
   a silicon dioxide layer that is formed on said single crystal oxide layer, said silicon dioxide layer is exposed to ion implantation producing an ion implantation stopping region in said single crystal oxide wafer;
   a silicon substrate that is bonded on said silicon dioxide layer, a selective number of bonded wafers being separated along said ion implantation stopping region resulting in the transfer of a thin single crystal oxide layer to the silicon substrate; and
   a BST layer that is directly formed on said thin single crystal oxide layer.

2. The BST microwave device of claim 1, wherein said silicon dioxide layer is formed by depositing silicon dioxide using CVD, PECVD, LPCVD, or ALD.

3. The BST microwave device of claim 1, wherein said silicon substrate is bonded to silicon dioxide layer using direct wafer bonding technology.

4. The BST microwave device of claim 3, wherein said silicon dioxide layer is exposed to hydrogen or helium ion implantation.

5. The BST microwave device of claim 1, wherein said BST layer suitable for the fabrication of an optical component.

6. The BST microwave device of claim 5, wherein said optical component comprises a microwave tunable component.

7. The BST microwave device of claim 6, wherein said microwave tunable component comprises a resonator, phase shifter, or tunable bandpass filter.

8. The BST microwave device of claim 1, wherein said silicon substrate comprises a removed portion so as to reduce microwave loss in said BST microwave device.

9. The BST microwave device of claim 8, wherein said removed portion is formed using KOH chemical etch.

10. A method of forming BST microwave device comprising:
    providing a single crystal oxide wafer comprising $SrTiO_3$, $MgAl_2O_4$, YSZ, or $CeO_2$;
    forming a silicon dioxide layer on said single crystal oxide layer;
    exposing said silicon dioxide layer to ion implantation producing an ion implantation stopping region in said single crystal oxide wafer;
    bonding a silicon substrate on said silicon dioxide layer
    separating a selective number of bonded wafers along said ion implantation stopping region resulting in the transfer of a thin single crystal oxide layer to the silicon substrate; and
    forming a BST layer directly on said thin single crystal oxide layer.

11. The method of claim 10, wherein said silicon dioxide layer is formed by depositing silicon dioxide using CVD, PECVD, LPCVD, or ALD.

12. The method of claim 10, wherein said silicon substrate is bonded to silicon dioxide layer using direct wafer bonding technology.

13. The method of claim 12, wherein said silicon dioxide layer is exposed to hydrogen or helium ion implantation.

14. The method of claim 10, wherein said BST layer suitable for the fabrication of an optical component.

15. The method of claim 14, wherein said optical component comprises a microwave tunable component.

16. The method of claim 15, wherein said microwave tunable component comprises a resonator, phase shifter, or tunable bandpass filter.

17. The method of claim 10, wherein said silicon substrate comprises a removed portion so as to reduce microwave loss in said BST microwave device.

18. The method of claim 17, wherein said removed portion is formed using KOH chemical etch.

* * * * *